(12) United States Patent
Tang et al.

(10) Patent No.: US 8,378,731 B1
(45) Date of Patent: Feb. 19, 2013

(54) ASYMMETRIC CORRECTION CIRCUIT WITH NEGATIVE RESISTANCE

(75) Inventors: Qiang Tang, Cupertino, CA (US); Bo Wang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 48 days.

(21) Appl. No.: 13/159,241

(22) Filed: Jun. 13, 2011

Related U.S. Application Data

(60) Provisional application No. 61/354,548, filed on Jun. 14, 2010.

(51) Int. Cl.
*H03L 5/00* (2006.01)

(52) U.S. Cl. ......... 327/306; 327/50; 330/254; 330/278; 360/46; 360/47

(58) Field of Classification Search .......... 327/50, 327/58, 62, 63, 65, 67–69, 306–308; 330/254, 330/260, 278, 279, 282, 284, 291; 360/46, 360/65, 67
See application file for complete search history.

(56) References Cited

U.S. PATENT DOCUMENTS

| | | | |
|---|---|---|---|
| 6,147,828 A * | 11/2000 | Bloodworth et al. | 360/65 |
| 6,545,534 B1 * | 4/2003 | Mehr | 330/69 |
| 6,621,346 B1 * | 9/2003 | Nabicht et al. | 330/284 |
| 6,906,584 B1 * | 6/2005 | Moffat et al. | 330/69 |
| 7,020,449 B2 * | 3/2006 | Shi | 455/234.1 |
| 7,065,336 B2 * | 6/2006 | Spiegel | 455/244.1 |
| 7,068,108 B2 * | 6/2006 | Xu et al. | 330/284 |
| 7,092,180 B2 * | 8/2006 | Franck | 360/46 |
| 7,161,752 B1 * | 1/2007 | Cheng | 360/46 |
| 7,242,545 B1 | 7/2007 | Cheng | |
| 2011/0260901 A1 * | 10/2011 | Zare-Hoseini | 341/155 |

\* cited by examiner

*Primary Examiner* — Lincoln Donovan
*Assistant Examiner* — William Hernandez

(57) ABSTRACT

In one embodiment, an apparatus includes an amplifier configured to receive an asymmetric signal. A first resistance is coupled between an input node and an output node of the amplifier. A second resistance is coupled to the input node of the amplifier. A first switch is configured to be controlled during a first interval to couple the second resistance to a positive resistance to increase a gain of the amplifier to correct the asymmetric signal. The gain is a function of the first resistance and a combination of the second resistance and the positive resistance. A second switch is configured to be controlled during a second interval to couple the second resistance to a negative resistance to decrease the gain of the amplifier to correct the asymmetric signal. The gain is a function of the first resistance and a combination of the second resistance and the negative resistance.

20 Claims, 7 Drawing Sheets

ASYMMETRIC CORRECTION CIRCUIT WITH NEGATIVE RESISTANCE

CROSS REFERENCE TO RELATED APPLICATIONS

The present disclosure claims priority to U.S. Provisional App. No. 61/354,548 for "Asymmetry Correction Circuit with Negative Resistance for the Read Channel" filed Jun. 14, 2010, which is incorporated herein by reference in its entirety for all purposes.

BACKGROUND

Particular embodiments generally relate to asymmetric correction circuits.

Unless otherwise indicated herein, the approaches described in this section are not prior art to the claims in this application and are not admitted to be prior art by inclusion in this section.

In a read channel for a hard disk drive, a signal received from a read head of the disk drive may be asymmetric. For better performance, the symmetry of the asymmetric signal should be corrected.

FIG. 1a depicts a graph 100 of an asymmetric signal 102 and ideal signal 104. Ideal signal 104 includes pulses in a period that have absolute peak amplitudes that are equal and asymmetric signal 102 has pulses that have unequal absolute peak amplitudes in the period. The correction of asymmetric signal 102 is performed to correct the asymmetry of asymmetric signal to be similar to the symmetry of ideal signal 104.

One way of correcting asymmetric signal 102 is to generate a square term that increases or decreases the amplitude of asymmetric signal 102. FIG. 1b depicts a graph showing the correction. A square term 106 is combined with asymmetric signal 102 to produce an output signal 108. However, an additional path and extra circuitry are needed to generate the square term.

Another way of correcting asymmetric signal 102 is to use extra signal currents. FIG. 2 depicts a conventional asymmetry correction circuit 200. Pbias transistors P1 and P2, cascode transistors C1 and C2, and Nbias transistors N1 and N2 are constantly biased. Transistors SWP are on when a signal INP is greater than a signal INM, and off otherwise. Also, transistors SWM are on when signal INP is less than signal INM, and off otherwise. Transistors CAS1$p$, CAS2$p$, CAS2$m$, and CAS1$m$ control the polarity of the currents. When CAS1$p$ and CAS1$m$ are on, and CAS2$p$ and CAS2$m$ are off. If transistor SWP is on, the signal current flows from output OUTP to output OUTM, through transistors CAS1$p$, SWP, INP, resistor Rdeg, and transistors INM, SWP, and CAS1$m$. Or if transistor SWM is on, the signal current still flows from output OUTP to output OUTM, through transistors CAS1$p$, SWM, INM, resistor Rdeg, and transistors INP, SWM, and CAS1$m$. By adding this asymmetric correction signal current to the main signal current, the final output signal current asymmetry may be corrected, similar to the way shown in FIG. 1b. Similarly, when transistors CAS1$p$ and CAS1$m$ are off, and transistors CAS2$p$ and CAS2$m$ are on, the signal current flows from output OUTM to output OUTP for correcting the opposite asymmetry polarity.

Although using the extra signal currents may correct the asymmetry of asymmetric signal 102, the use of the extra signal currents needs a higher supply voltage due to stacking switches on top of the signal current path, and may cause higher power usage, higher current, and use more area on an integrated circuit (IC) chip.

SUMMARY

In one embodiment, an apparatus includes an amplifier configured to receive an asymmetric signal. A first resistance is coupled between an input node and an output node of the amplifier. A second resistance is coupled to the input node of the amplifier. A first switch is configured to be controlled during a first interval to couple the second resistance to a positive resistance to increase a gain of the amplifier to correct the asymmetric signal. The gain is a function of the first resistance and a combination of the second resistance and the positive resistance. A second switch is configured to be controlled during a second interval to couple the second resistance to a negative resistance to decrease the gain of the amplifier to correct the asymmetric signal. The gain is a function of the first resistance and a combination of the second resistance and the negative resistance.

In one embodiment, the positive resistance is coupled to the second resistance to reduce a resistance between a first node and the input node of the amplifier.

In one embodiment, the negative resistance is coupled to the second resistance to add the negative resistance in parallel to the second resistance.

In another embodiment, an apparatus includes an amplifier configured to receive a differential asymmetric signal including a first asymmetric signal and a second asymmetric signal. A first resistance is coupled to the first input node of the amplifier and to the first asymmetric signal. A second resistance is coupled to the first asymmetric signal and the first input node. A first switch is configured to be controlled during a first interval to couple the second resistance to first resistance to increase a gain of the amplifier to correct the first asymmetric signal at a first output node of the amplifier. A third resistance is coupled to the second asymmetric signal. A second switch is configured to be controlled during a second interval to couple the third resistance to the first resistance to decrease the gain of the amplifier to correct the asymmetric signal at the first output node of the amplifier. The second asymmetric signal is of an opposite polarity to the first asymmetric signal.

In one embodiment, a fourth resistance is coupled to the first asymmetric signal. A fifth resistance is coupled to the second input node of the amplifier and the second asymmetric signal. A third switch is configured to be controlled during the second interval to couple the fourth resistance to fifth resistance to decrease the gain of the amplifier to correct the second asymmetric signal at the second output node.

In another embodiment, a method includes: coupling a first resistance to a first input node of an amplifier and to a first asymmetric signal; coupling a second resistance to the first asymmetric signal and the first input node; during a first interval, coupling the second resistance to first resistance to increase a gain of the amplifier to correct the first asymmetric signal at a first output node of the amplifier; coupling a third resistance to a second asymmetric signal; and during a second interval, coupling the third resistance to the first resistance to decrease the gain of the amplifier to correct the asymmetric signal at the first output node, wherein the second asymmetric signal is of an opposite polarity to the first asymmetric signal.

The following detailed description and accompanying drawings provide a more detailed understanding of the nature and advantages of the present invention.

DETAILED DESCRIPTION

Described herein are techniques for asymmetric correction using a negative resistance. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1A:
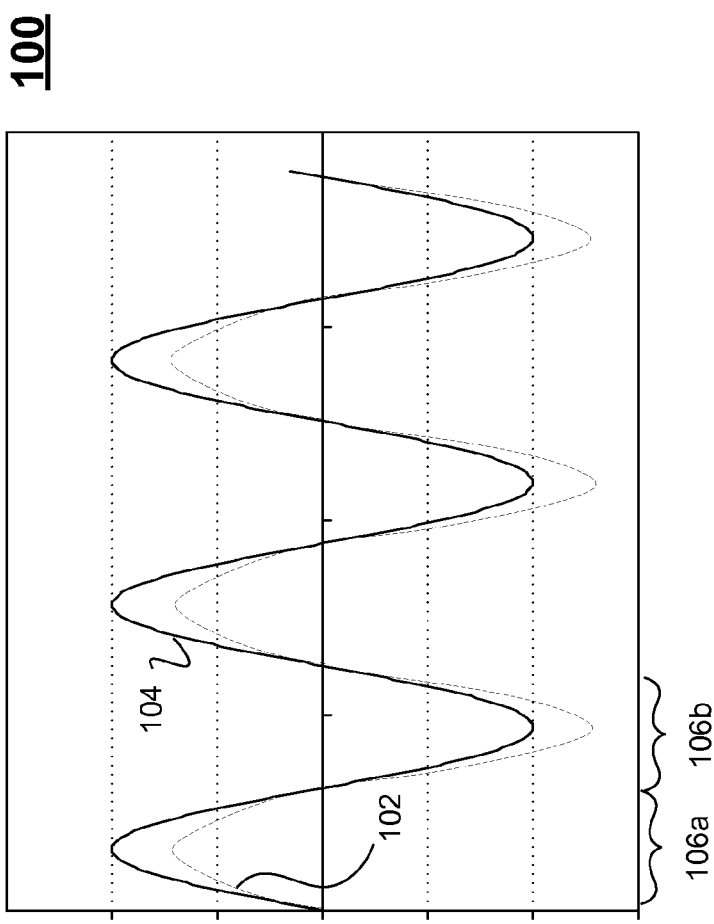
FIG. 1a depicts a graph of an asymmetric signal and ideal signal.
Figure 1B:
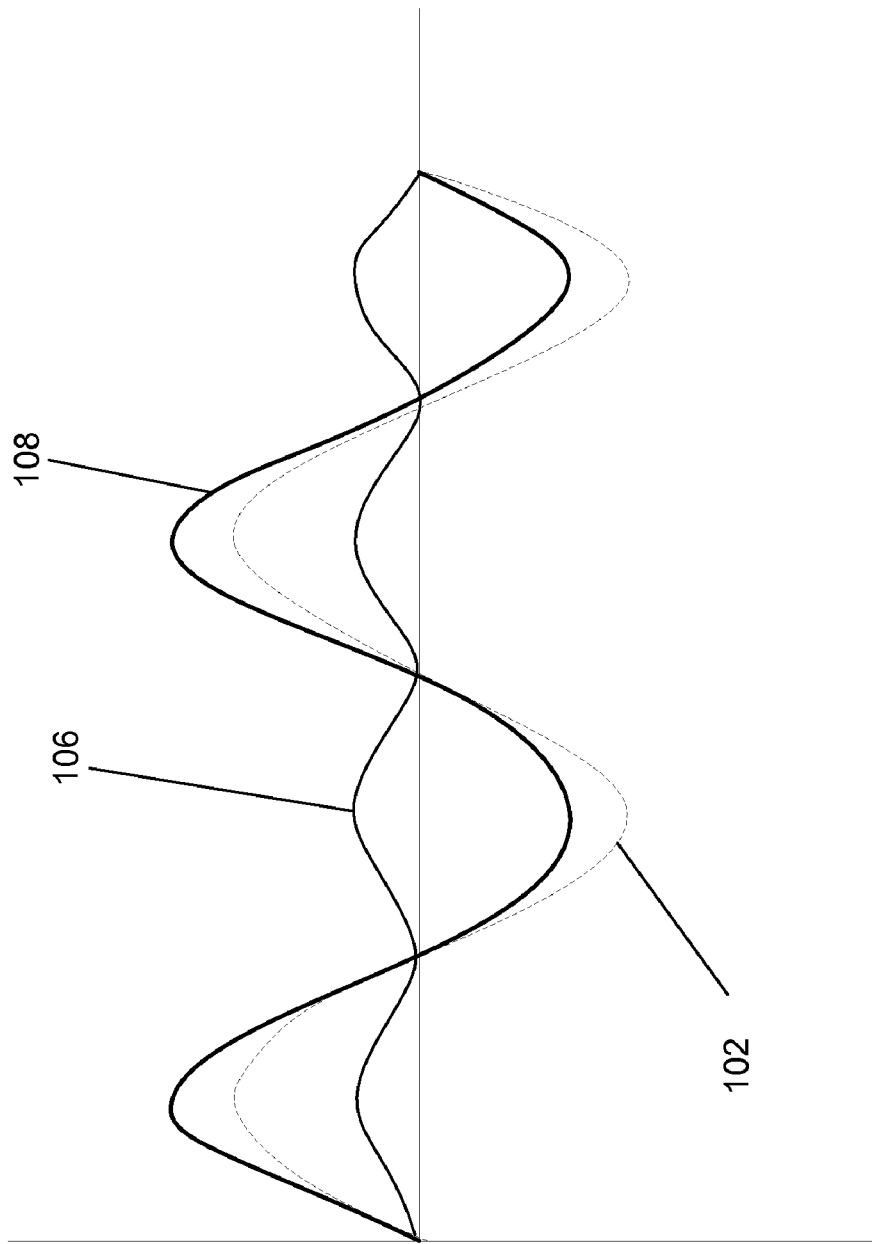
FIG. 1b depicts a graph showing asymmetric correction.
Figure 2:
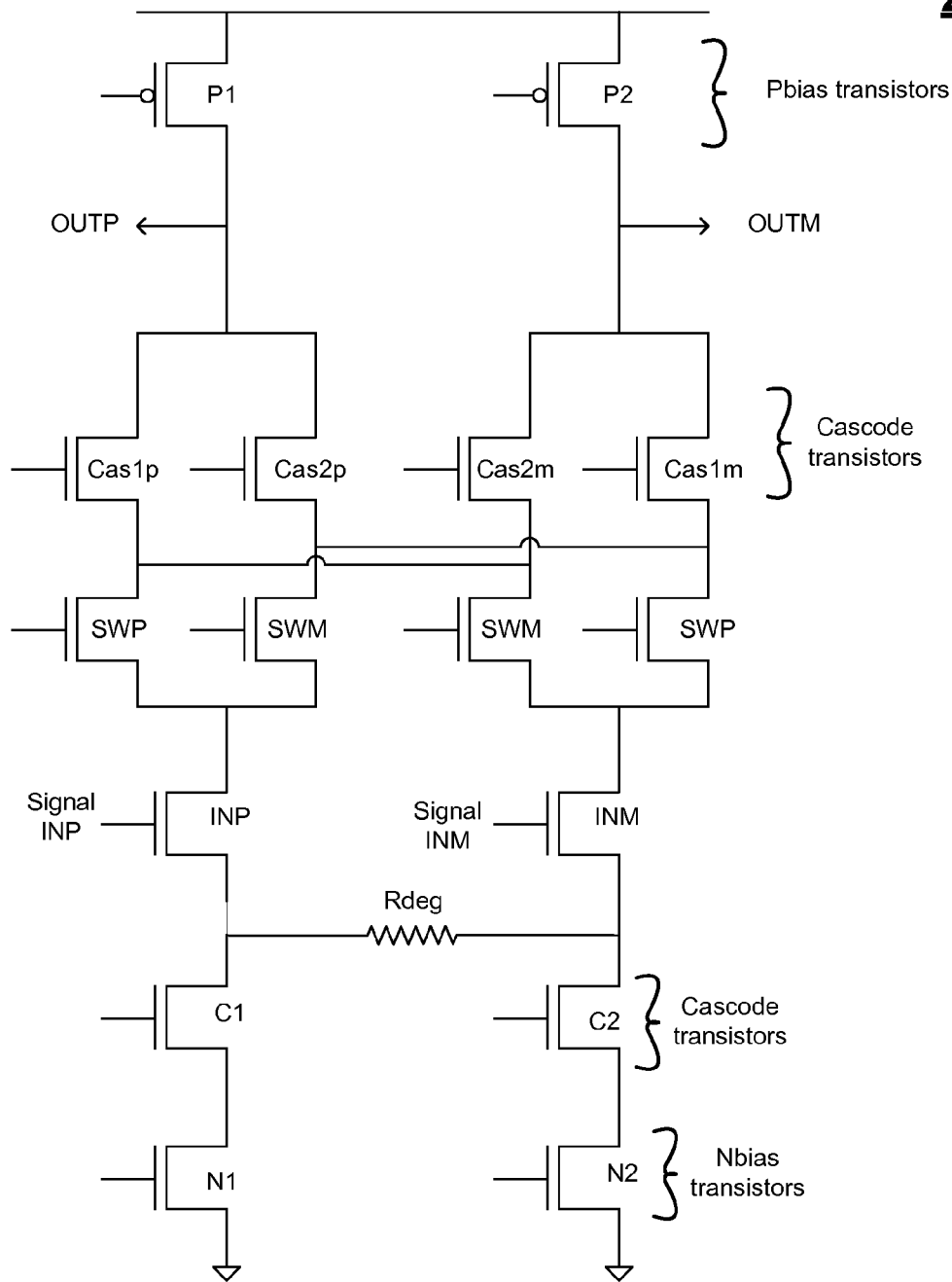
FIG. 2 depicts a conventional asymmetry correction circuit.
Figure 3:
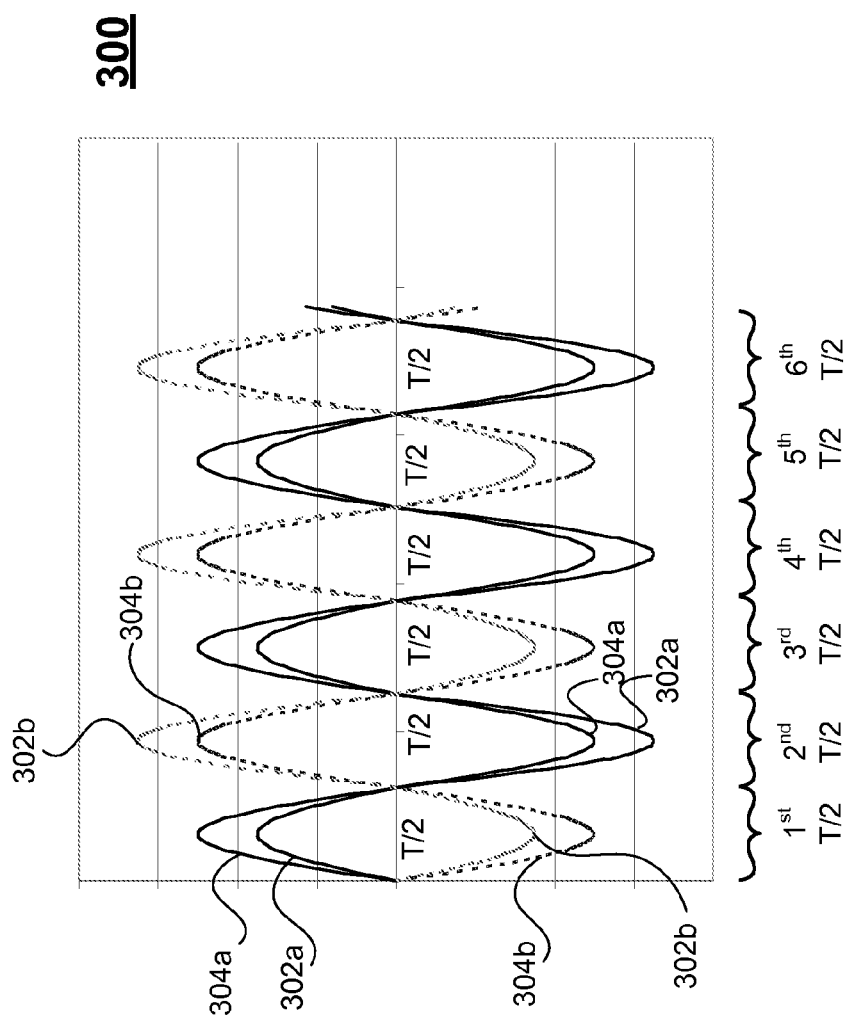
FIG. 3 shows an example of a graph showing a differential asymmetric signal according to one embodiment.

FIG. 3 shows an example of a graph 300 showing a differential asymmetric signal according to one embodiment. A positive asymmetric signal 302a and a negative asymmetric signal 302b form the differential asymmetric signal. Also, a positive ideal signal 304a and a negative ideal signal 304b are shown. To correct asymmetric signals 302a and 302b, the gain is boosted in the signal path for asymmetric signals 302a and 302b in odd half periods, e.g., a first T/2, a third T/2, a fifth T/2, and so on. This increases the amplitude of the asymmetric signal to be closer to the amplitude of ideal signals 304a and 304b, respectively. For example, as shown in the first T/2, the amplitude of asymmetric signal 302a is below that of ideal signal 304a and increasing the amplitude of asymmetric signal 302a corrects the symmetry of asymmetric signal. Also, asymmetric signal 302b may have the gain increased in the negative direction.

Also, the amplitude of asymmetric signal 302a and 302b is above the peak amplitude of ideal signal 304a in the even half periods. If the signal path gain is reduced for the even half periods, e.g., a second T/2, a fourth T/2, a sixth T/2, and so on, then asymmetric signals 302a and 302b have their amplitude reduced to be closer to the amplitude of ideal signals 304a and 304b.

Figure 4:
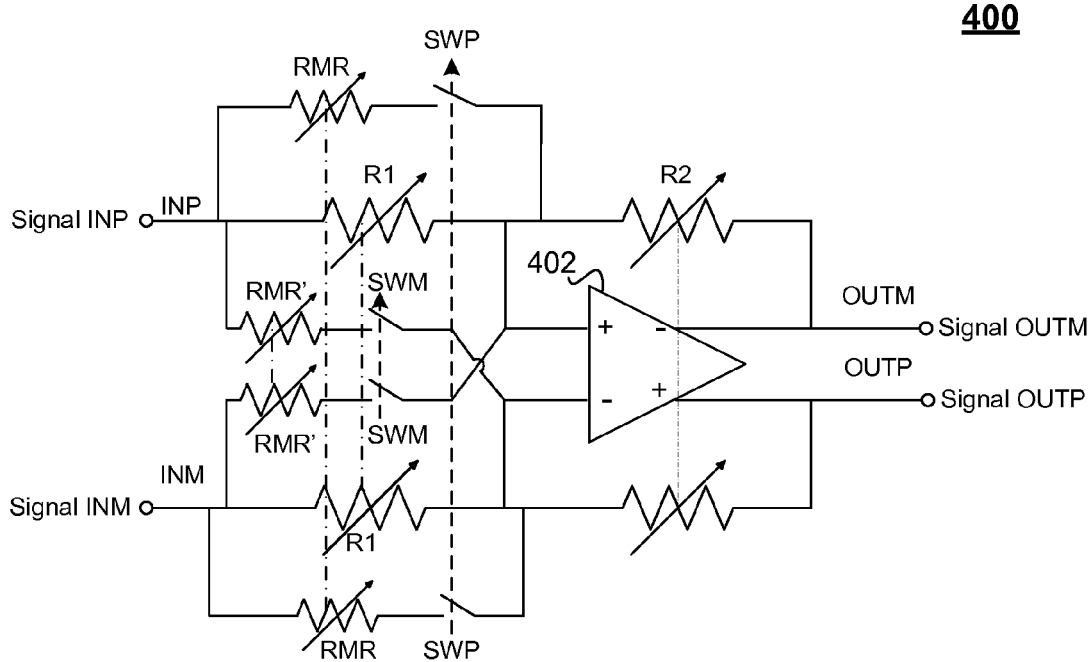
FIG. 4 depicts a system for correcting an asymmetric signal according to one embodiment.

FIG. 4 depicts a system 400 for correcting an asymmetric signal according to one embodiment. System 400 may be used in a read channel to process a signal received from a read-head of a hard disk drive (HDD). However, system 400 may be used in other applications where correction of an asymmetric signal is required. The asymmetric signal may be received from a pre-amplifier in the read channel. A corrected signal may then be output to an analog processor, such as an analog-to-digital converter (ADC).

The asymmetric signal may be received at a variable gain amplifier (VGA) 402. In one embodiment, the asymmetric signal may be a differential asymmetric signal including signal INP and signal INM. When used in this disclosure, the asymmetric signal may refer to a differential version or a single-ended version.

Amplifier 402 corrects an asymmetric signal input received at input nodes INP and INM to output the corrected signal at output nodes OUTM and OUTP. The asymmetric signal is corrected by increasing or decreasing the gain of amplifier 402. As will be described in more detail below, the gain of amplifier 402 may be decreased by adding a negative resistance to the input resistance. Also, the gain of amplifier 402 may be increased by adding a positive resistance to the input resistance to increase the gain of amplifier 402.

To provide for the variable gain, switches SWP and SWM are used to change signal path gain according to signal polarity. As will be described below, a switch driver is used to drive switches SWP and SWM such that at one interval both of switches SWP are closed and both of switches SWM are open. During a second interval, both of switches SWP are open and both of switches SWM are closed.

For signal INP, the magnitude of asymmetry correction is controlled by the ratio of resistances RMR\R1 and resistances RMR'\R1. That is, a resistor RMR may be added in parallel to resistor R1 or a resistor RMR' may be added in parallel to resistor R1. Variable gain is achieved by varying the ratio between an input resistance Rin and a feedback resistance R2. The input resistance Rin is the resistance seen at an input of amplifier 402, such as the positive or negative input of amplifier 402. The feedback resistance is the resistance between node OUTM and the positive input of amplifier 402 or node OUTP and the negative input of amplifier 402. The gain of amplifier 402 is R2\Rin. Particular embodiments vary the input resistance Rin by adding resistor RMR or resistor RMR' to resistor R1. In one embodiment, the feedback resistance is not varied by adding resistors in parallel to resistor R2. This may simplify the control of which resistors are added in parallel. For example, control is needed to either add resistor RMR in parallel to resistor R1 or resistor RMR' in parallel to resistor R1. No control is needed to add any resistors in parallel to resistor R2 in conjunction with adding resistor RMR or resistor RMR' to resistor R1.

As discussed above, the signal path gain may be increased for the odd half periods. For the odd half periods, switches SWP may be closed. When switches SWP are closed, resistor RMR is added in parallel to resistor R1. Resistor RMR is a positive resistance and when added in parallel to resistor R1, the input resistance is reduced. For example, the input resistance Rin is (R1*RMR)\(R1+RMR). Due to the ratio of gain being R2/Rin, a smaller input resistance increases the signal gain accordingly.

When signal gain needs to be decreased during the even half periods, switches SWM are closed. In this case, a negative resistance RMR' is added in parallel to resistor R1. Resistance RMR' is considered a negative resistance because resistance RMR' appears as a negative resistance to an input of amplifier 402. An implementation of the negative resistance will be discussed below. Adding negative resistance RMR' increases the input resistance to (R1*RMR')\(R1−RMR'). In one embodiment, resistor RMR' is the same resistance value as resistor RMR, but appears as a negative resistance to the input of amplifier 402. Increasing the input resistance reduces the signal gain accordingly.

Accordingly, the process of increasing gain for a half period and then decreasing gain for a next half period may continue for successive half periods to correct signal asymmetry. The above also applies for the path for signal INM. For example, when switch SWP is closed, the input resistance is reduced to increase the gain. When switch SWM is closed, the input resistance is increased to reduce the signal gain. The increase in gain the first half period and decrease in gain in the next half period corrects the asymmetry of signal INM.

A negative resistance may be implemented in different ways. In one embodiment, the negative resistance is implemented by coupling resistor RMR' in parallel to resistor R1 where resistor RMR' is coupled to an input signal of an opposite polarity to an input signal coupled to resistor R1.

For input signal INP, the positive resistance is connected when a switch SWP is on and a switch SWM is off. The input resistance between node INP and the positive input of amplifier 402 is a resistance of resistors R1 and RMR in parallel. The input resistance may then be expressed as 1\((1\R1)+(1\RMR))=R1*RMR\(R1+RMR). The current flowing through resistor R2 is $V_{INP}*((1\R1)+1\RMR))$, where $V_{INP}$ is the positive voltage at node INP. The current through resistor R2 creates the voltage at node OUT N.

When switch SWP is off and switch SWM is on, the resistance between node INP and the positive input of amplifier 402 is resistor R1. Resistor RMR' connects node INM to the positive input of amplifier 402. Thus, signal INM is coupled through resistor RMR' to the positive input of amplifier 402. Assuming that voltage $V_{INM}=-V_{INP}$ (because the polarity of signal INM is opposite the polarity of signal INP), the current flowing through resistor R2 is $V_{INP}*(1/R1)-V_{INP}*(1/RMR')$. Compared with the case when switch SWP is closed, a negative resistor −1\RMR appears to be added in parallel to resistor R1. This reduces the current through resistor R2 and reduces the voltage at output OUTM.

A person skilled in the art would be able to perform an equivalent analysis for the negative resistance coupled to the negative input of amplifier 402 based on the teachings and disclosure herein.

Figure 5:
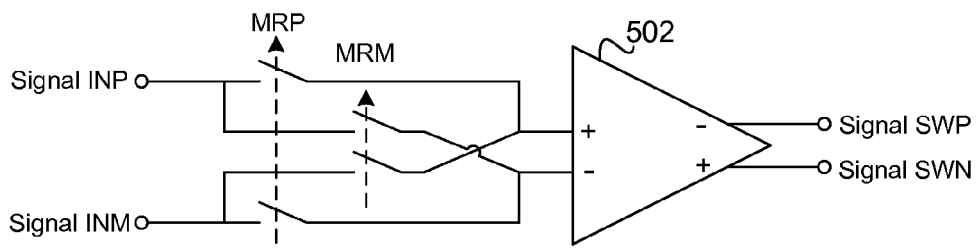
FIG. 5 shows an example of a driver circuit according to one embodiment.

Switches SWM and SWP may be controlled using a driver circuit. FIG. 5 shows an example of a driver circuit 500 according to one embodiment. Signals INP and INM are coupled to an amplifier 502 to generate control signals SWP and SWM, which are used to control switches SWP and SWM, respectively. For example, when control signal SWP is in a first state (e.g., a high state), switches SWP are closed (and switches SWP are open when control signal SWP is in a second state (e.g., low state)). Conversely, when control signal SWM is in the first state, switches SWM are closed (and switches SWM are open when control signal SWM is in a second state (e.g., low state)).

When signal INP is positive and signal INM is negative, switches MRM are controlled to couple signal INM to the positive input of amplifier 502 and signal INP to the negative input of amplifier 502. This causes control signal SWP to go high and control signal SWM to go low. Switches SWP are closed and switches SWM are open in this case.

When signal INP is negative and signal INM is positive, switches MRP are closed to couple signal INP to the positive input of amplifier 502 and signal INM to the negative input of amplifier 502. This causes control signal SWP to go low and control signal SWM to go high. Switches SWM are closed and switches SWP are open in this case.

Figure 6:
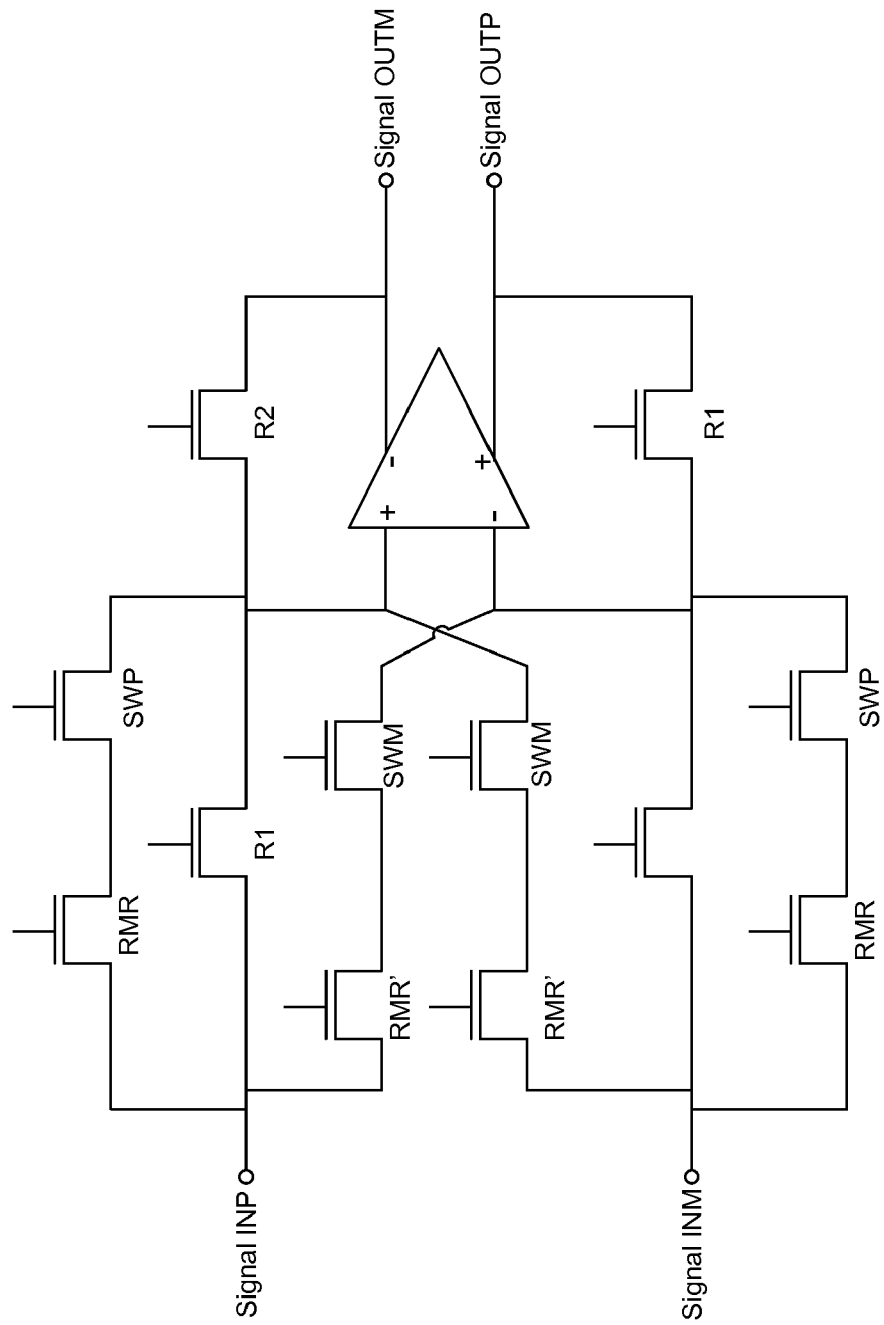
FIG. 6 shows an example of the system using transistors to implement the resistors according to one embodiment.

Particular embodiments may use different implementations of the resistors shown in FIG. 4. In one example, transistors may be used to implement the resistors. Although transistors are described, it will be understood that other circuits may be used to implement the resistances. FIG. 6 shows an example of system 300 using transistors to implement the resistors according to one embodiment. As shown, resistors R1, R2, RMR, and RMR' have been implemented using transistors R1, R2, RMR, and RMR'. The transistors use N channel metal oxide semiconductor field effect transistors (NMOSFET) technology; however, other transistor types may be used. By controlling the gate voltages of the transistors R1, R2, RMR, and RMR', the resistance between the drain and source of each transistor may provide the desired resistance.

Switches SWP and SWM may also be implemented using transistors SWP and SWM. For example, a transistor SWP for switch SWP may be turned on when switch SWP is closed and transistor SWP may be turned off when switch SWP is open.

The amount of resistance may be changed based on the amount of asymmetric correction that is needed. For example, resistors RMR and RMR' may provide a 10% adjustment of resistor R1 in a positive or negative direction. Thus, 10% asymmetry of the asymmetric signal may be corrected using the resistors RMR and RMR'. If a larger adjustment is needed, then resistor R2 or resistor R1 may be changed.

In the case where resistor R2 is changed, resistors RMR, RMR', and R1 do not need to be changed. That is, the change in gain is achieved by just varying the resistance of resistor R2. Further, because there are no resistors that are coupled in parallel with resistor R2, no other changes are needed when resistor R2 is changed.

In the case where resistor R1 is changed, resistors RMR and RMR' need to be changed to maintain the desired 10% asymmetry. That is, if the resistance of R1 changes, then the amount of resistance for resistors RMR and RMR' needed to maintain the 10% correction in gain changes based on the change in resistance of R1.

Figure 7:
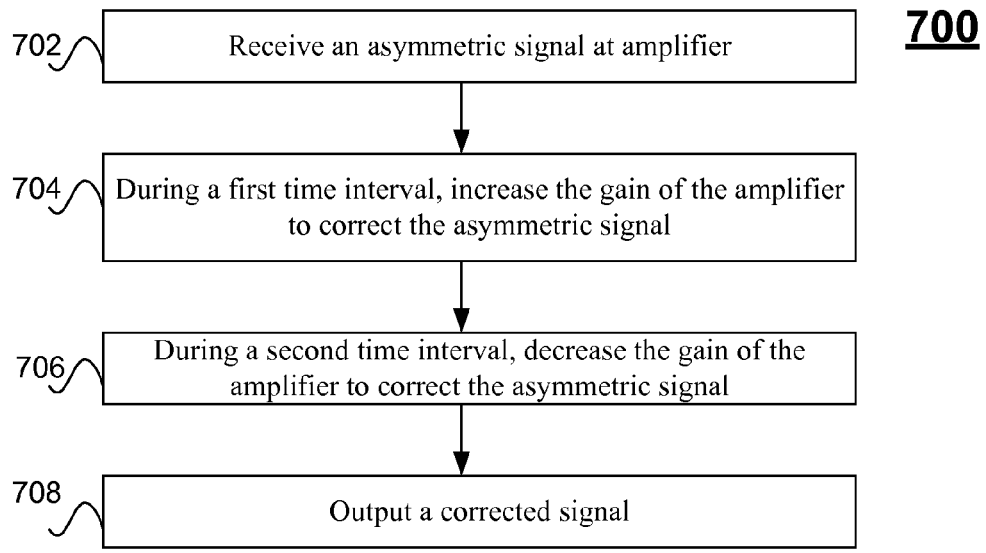
FIG. 7 depicts a simplified flowchart of a method for performing asymmetric correction according to one embodiment.

FIG. 7 depicts a simplified flowchart 700 of a method for performing asymmetric correction according to one embodiment. At 702, an asymmetric signal is received at amplifier 402. At 704, during a first time interval, the gain of amplifier 402 is increased to correct the asymmetric signal. For example, a positive resistance is coupled in parallel with resistor R1. This decreases the input resistance and increases the gain.

At 706, during a second time interval, the gain of amplifier 402 is decreased to correct the asymmetric signal. For example, a negative resistance is coupled in parallel to resistor R1. This increases the input resistance and decreases the gain.

At 708, a corrected signal is output by amplifier 402.

Particular embodiments provide a high bandwidth, low distortion, and low power solution for asymmetry correction. The process works under a low supply voltage condition. Also, switches SWP and SWM only refer to the input signals and balanced timing may be achieved resulting in less distortion and improved correction. For example, switches are not used for altering the feedback resistance and thus timing to coordinating switches SWP and SWM in both the input resistance and feedback resistance is not needed. Also, the magnitude of correction only refers to the input resistance and the control of resistors RMR and RMR' is simplified as only resistor RMR and resistor RMR' may be coupled in parallel to resistor R1 while resistor R2 remains the same.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
an amplifier configured to receive an asymmetric signal;
a first resistance coupled between an input node and an output node of the amplifier;
a second resistance coupled to the input node of the amplifier;
a first switch configured to be controlled during a first interval to couple the second resistance to a positive resistance to increase a gain of the amplifier to correct the asymmetric signal, wherein the gain is a function of the first resistance and a combination of the second resistance and the positive resistance; and
a second switch configured to be controlled during a second interval to couple the second resistance to a negative resistance to decrease the gain of the amplifier to correct the asymmetric signal, wherein the gain is a function of the first resistance and a combination of the second resistance and the negative resistance.

2. The apparatus of claim 1, wherein the positive resistance is coupled to the second resistance to reduce a resistance between a first node and the input node of the amplifier.

3. The apparatus of claim 2, wherein the positive resistance is coupled in parallel to the second resistance.

4. The apparatus of claim 1, wherein the negative resistance is coupled to the second resistance to add the negative resistance in parallel to the second resistance.

5. The apparatus of claim 4, wherein:
the second resistance is coupled between a first node and the input node of the amplifier, and
the negative resistance is coupled in between a second node and the input node of the amplifier, wherein the first node receives a first signal having an opposite polarity from a second signal received at the second node.

6. The apparatus of claim 1, further comprising a switch driver, wherein an output of the switch driver controls:
the first switch to be closed during the first interval and to be open during the second interval, and
the second switch to be closed during the second interval and to be open during the first interval.

7. The apparatus of claim 6, wherein the amplifier comprises a first amplifier and the input node comprises a first input node, the apparatus further comprising:
a second amplifier comprising a second input node and a third input node;
a third switch configured to couple a first input signal to the second input node during the first interval; and
a fourth switch configured to couple the input signal to the second input node during the second interval.

8. The apparatus of claim 1, wherein:
the asymmetric signal comprises a differential asymmetric signal, the positive resistance comprises a first positive resistance, and the negative resistance comprises a second negative resistance,
the first switch couples the second resistance and the first positive resistance to a first input node of the amplifier,
the second switch couples the second resistance and the first negative resistance to the first input node of the amplifier,
the apparatus further comprising:
a third switch configured to be controlled during the first interval to couple a third resistance to a second positive resistance to a second input node of the amplifier to increase the gain of the amplifier to correct the asymmetric signal; and
a fourth switch configured to be controlled during the second interval to couple the third resistance to a second negative resistance to the second input node of the amplifier to decrease the gain of the amplifier to correct the asymmetric signal.

9. An apparatus comprising:
an amplifier configured to receive a differential asymmetric signal comprising a first asymmetric signal and a second asymmetric signal;
a first resistance coupled to a first input node of the amplifier and to the first asymmetric signal;
a second resistance coupled to the first asymmetric signal and the first input node;
a first switch configured to be controlled during a first interval to couple the second resistance to first resistance to increase a gain of the amplifier to correct the first asymmetric signal at a first output node of the amplifier;
a third resistance coupled to the second asymmetric signal; and
a second switch configured to be controlled during a second interval to couple the third resistance to the first resistance to decrease the gain of the amplifier to correct the asymmetric signal at the first output node of the amplifier, wherein the second asymmetric signal is of an opposite polarity to the first asymmetric signal.

10. The apparatus of claim 9, further comprising:
a fourth resistance coupled to the first asymmetric signal;
a fifth resistance coupled to a second input node of the amplifier and the second asymmetric signal; and
a third switch configured to be controlled during the second interval to couple the fourth resistance to fifth resistance to decrease the gain of the amplifier to correct the second asymmetric signal at a second output node.

11. The apparatus of claim 10, wherein the third resistance and the fourth resistance are negative resistances.

12. The apparatus of claim 10, further comprising:
a sixth resistance coupled to the second input node of the amplifier and the second asymmetric signal; and
a fourth switch configured to be controlled during the first interval to couple the sixth resistance to fifth resistance to increase the gain of the amplifier to correct the second asymmetric signal at the second output node.

13. The apparatus of claim 12, wherein the first resistance and the sixth resistance are positive resistances.

14. The apparatus of claim 12, wherein:
the second switch and the third switch are controlled by a first driver signal; and
the first switch and the fourth switch are controlled by a second driver signal.

15. The apparatus of claim 14, wherein the amplifier comprises a first amplifier, the apparatus further comprising:
a second amplifier comprising a third input node and a fourth input node;
input circuitry coupled to the first asymmetric signal and the second asymmetric signal, wherein:
during the first interval, the input circuitry causes input of the first asymmetric signal into the fourth input node and the second asymmetric signal into the third input node; and during the second interval, the input circuitry causes input of the first asymmetric signal into the third input node and the second asymmetric signal into the fourth input node.

16. A method comprising:

coupling a first resistance to a first input node of an amplifier and to a first asymmetric signal;

coupling a second resistance to the first asymmetric signal and the first input node;

during a first interval, coupling the second resistance to first resistance to increase a gain of the amplifier to correct the first asymmetric signal at a first output node of the amplifier;

coupling a third resistance to a second asymmetric signal; and during a second interval, coupling the third resistance to the first resistance to decrease the gain of the amplifier to correct the first asymmetric signal at the first output node, wherein the second asymmetric signal is of an opposite polarity to the first asymmetric signal.

17. The method of claim 16, further comprising:

coupling a fourth resistance to the first asymmetric signal;

coupling a fifth resistance to a second input node of the amplifier and the second asymmetric signal; and during the second interval, coupling the fourth resistance to fifth resistance to decrease the gain of the amplifier to correct the second asymmetric signal at a second output node.

18. The method of claim 17, wherein the third resistance and the fifth resistance are negative resistances.

19. The method of claim 17, further comprising:

coupling a sixth resistance to the second input node of the amplifier and the second asymmetric signal; and during the first interval, coupling the sixth resistance to fifth resistance to increase the gain of the amplifier to correct the second asymmetric signal at the second output node.

20. The method of claim 19, wherein the first resistance and the sixth resistance are positive resistances.

* * * * *